United States Patent [19]

Hung

[11] Patent Number: 5,781,756

[45] Date of Patent: Jul. 14, 1998

[54] PROGRAMMABLE LOGIC DEVICE WITH PARTIALLY CONFIGURABLE MEMORY CELLS AND A METHOD FOR CONFIGURATION

[75] Inventor: Lawrence C. Hung, Los Gatos, Calif.

[73] Assignee: Xilinx, Inc., San Jose, Calif.

[21] Appl. No.: 222,141

[22] Filed: Apr. 1, 1994

[51] Int. Cl.$^6$ ............................................. G06F 9/26
[52] U.S. Cl. ........................................ 395/430; 326/38
[58] Field of Search .......................... 395/400, 425, 395/421.09, 421.07, 421.08; 326/39, 40, 38; 365/230.06, 230.08, 189.12

[56] References Cited

U.S. PATENT DOCUMENTS

| | | | |
|---|---|---|---|
| Re. 34,363 | 8/1993 | Freeman | 326/38 |
| 3,577,190 | 5/1971 | Cocke | 395/567 |
| 4,124,899 | 11/1978 | Birkner et al. | 364/716 |
| 4,706,216 | 11/1987 | Carter | 365/94 |
| 4,750,155 | 6/1988 | Hsieh | 365/203 |
| 4,758,745 | 7/1988 | Elgamal et al. | 326/16 |
| 4,782,466 | 11/1988 | Yamaguchi et al. | 365/149 |
| 4,811,294 | 3/1989 | Kobayashi et al. | 365/189 |
| 4,821,233 | 4/1989 | Hsieh | 365/203 |
| 4,870,302 | 9/1989 | Freeman | 326/41 |
| 5,148,390 | 9/1992 | Hsieh | 365/95 |
| 5,198,705 | 3/1993 | Galbraith et al. | 326/27 |
| 5,243,238 | 9/1993 | Kean | 326/41 |
| 5,258,668 | 11/1993 | Cliff | 326/41 |
| 5,260,611 | 11/1993 | Cliff | 326/39 |
| 5,260,881 | 11/1993 | Agrawal et al. | 364/489 |
| 5,267,187 | 11/1993 | Hsieh | 364/784 |
| 5,280,202 | 1/1994 | Chan | 307/465 |
| 5,301,155 | 4/1994 | Wada et al. | 365/201 |
| 5,341,341 | 8/1994 | Fukuzo | 365/233 |
| 5,377,142 | 12/1994 | Matsumura et al. | 365/189.01 |
| 5,379,262 | 1/1995 | Okamoto et al. | 365/230.01 |
| 5,379,410 | 1/1995 | Okada | 395/575 |
| 5,410,097 | 4/1995 | Kato | 84/610 |
| 5,416,740 | 5/1995 | Fujita et al. | 365/200 |
| 5,430,687 | 7/1995 | Hung et al. | 365/230.08 |
| 5,448,714 | 9/1995 | Stodieck | 395/476 |
| 5,469,559 | 11/1995 | Parks et al. | 395/433 |
| 5,473,761 | 12/1995 | Parks et al. | 395/404 |
| 5,491,809 | 2/1996 | Coffman et al. | 395/430 |

FOREIGN PATENT DOCUMENTS

WO 93/05577  8/1992  WIPO.

OTHER PUBLICATIONS

Xilinx, Inc. The Programmable Logic Data Book, 1993, pp. 1–1 through 1–7; 2–1 through 2–42; 2–97 through 2–130; and 2–177 through 2–204, available from Xilinx, Inc., 2100 Logic Drive, San Jose, California 95124.

Xilinx Programmable Gate Array Data Book, 1989, pp. 6–30 through 6–44, available from Xilinx, Inc., 2100 Logic Drive, San Jose, California 95124.

Morales, Luis. "Boundary Scan in XC4000 Devices", XAPP 017.001, Oct. 1992, pp. 1–19.

Primary Examiner—Eddie P. Chan
Assistant Examiner—Hiep T. Nguyen
Attorney, Agent, or Firm—LeRoy D. Maunu, Esq.; Edel M. Young

[57] ABSTRACT

A field programmable gate array having memory cells that can be partially reconfigured comprises an array of tiles having logic blocks and routing structures, an array of associated memory cells, a data register, an address register and a memory configuration device. The data register is coupled to store data in the memory cells, and the address register is coupled to address the memory cells by column. The memory configuration device preferably comprises a register, a decoder and a control unit for receiving a bit stream including a skip command or a write command plus data. The memory configuration device allows the memory cells to be partially reconfigured by allowing each column of memory cells to be selectively written or skipped in response to the command inserted into the bit stream. The present invention also comprises a method for partially reconfiguring the memory cells including the steps of: retrieving a packet from a bit stream; determining whether the packet is a write command; if the packet is a write command, retrieving a frame of data from the bit stream and loading the frame of data into a data register; if the packet is a write command, loading the frame of data into a group of memory cells; and incrementing an address register.

15 Claims, 7 Drawing Sheets

```
... <write><data frame>
    <write><data frame>
    <write><data frame>
    <write><data frame>
    <write><data frame>...
```

FIG. 3A (PRIOR ART)

```
.... <skip>
     <write><data frame>
     <skip>
     <skip>
     <write><data frame> ....
```

FIG. 3B

PROGRAMMABLE LOGIC DEVICE WITH PARTIALLY CONFIGURABLE MEMORY CELLS AND A METHOD FOR CONFIGURATION

CROSS-REFERENCE TO RELATED APPLICATIONS

This application relates to the following concurrently filed and commonly assigned U.S. patents on co-pending U.S. patent applications:

1. Ser. No. 08/222,138 invented by Danesh Tavana, Wilson K. Yee, and Victor A. Holen entitled "TILE BASED ARCHITECTURE FOR FPGA".
2. Ser. No. 08/221,679 invented by Danesh Tavana entitled "I/O INTERFACE CELL FOR USE WITH OPTIONAL PAD".
3. U.S. Pat. No. 5,453,706 invented by Wilson K. Yee entitled "FIELD PROGRAMMABLE GATE ARRAY PROVIDING CONTENTION FREE CONFIGURATION AND RECONFIGURATION".
4. Ser. No. 08/223,083 invented by Wilson K. Yee entitled "A PROGRAMMABLE SCAN-CHAIN TESTING STRUCTURE AND METHOD".
5. U.S. Pat. No. 5,430,687 invented by Lawrence C. Hung and Charles R. Erickson entitled "A PROGRAMMABLE LOGIC DEVICE INCLUDING A PARALLEL INPUT DEVICE FOR LOADING MEMORY CELLS", and all of which are incorporated herein by reference.

BACKGROUND OF THE INVENTION

1. Field of the Invention

The present invention relates generally to programmable logic devices formed on integrated circuits, and more particularly to a system and method for reconfiguring the memory cells of a field programmable gate array (FPGA).

2. Description of the Related Art

The use of programmable logic devices such as static random access memory (SRAM) FPGAs has become widespread because of the flexibility provided by their re-programmability. A FPGA typically includes an array of programmable logic blocks that can be programmably interconnected to each other to provide the logic function desired by the user. The Xilinx 1993 data book entitled "The Programmable Logic Data Book," available from Xilinx, Inc., 2100 Logic Drive, San Jose, Calif. 95124, describes several products for implementing FPGA architectures including exemplary FPGAs. This data book is incorporated herein by reference. An FPGA typically includes a regular array of identical logic blocks. Each of the logic blocks may be programmed to perform any one of a number of different logical functions. The FPGA has programmable connecting structures for coupling the logic blocks together according to a desired configuration. The FPGA also includes a number of configuration memory cells. The configuration memory cells are coupled to the programmable logic blocks for specifying the function performed by each logic block, and to the programmable connecting structures for specifying the coupling of the inputs and outputs of the logic blocks. The FPGA also typically includes data storage memory cells accessible to a user during operation of the FPGA, but the discussion here of memory cells refers to configuration memory cells. Each logic block is coupled to several memory cells that specify the function that the logic block will perform, and the other logic blocks to which it will be coupled. Thus, by storing different values in the memory cells each logic block may be individually programmed as to its function and coupling.

One problem with existing FPGAs is that all the memory cells in the FPGA must be re-written in order to change the configuration of the FPGA. FPGAs typically provide a single address register and a single data register for storing configuration data into memory cells. The use of a single address register and a single data register for accessing the memory cells saves space on the FPGA, however, single registers greatly increase the time required to store new configuration data in the memory cells. A typical FPGA can have more than ten thousand memory cells that must be written in order to configure the FPGA. Since each memory cell must be written to when the FPGA is reconfigured, the time required can be undesirably long for some applications. Thus, there is a need for a system and method for reducing the time required to reconfigure FPGAs.

Another problem with existing FPGAs is the time required to test them. Before an FPCA is sold, it must be tested by the manufacturer to ensure that each logic block in the array is able to perform all the logic functions allowed, and also to ensure that each logic block may be coupled to other logic blocks in all the possible defined configurations. In order to test the FPGA, different sets of test data must be stored in the memory cells to configure the FPGA in a variety of different configurations. Signals can then be applied to the inputs of the FPGA to determine whether the FPGA is operating properly. Since all the cells must be re-written each time the FPGA is reconfigured, the time required to test the FPGA is great even though the configuration data re-written in the memory cells for one set of test data may differ only slightly from the previous set. This is a particular problem since the cost of such programmable logic devices increases with the time required to test them.

Therefore, there is a need for a system and method that allow FPGAs to be reconfigured more efficiently and quickly. In particular, there is a need for a system and method that allows reconfiguration of selected groups of memory cells as opposed to reconfiguration of all the memory cells in the FPGA as currently required by the prior art.

SUMMARY OF THE INVENTION

The present invention overcomes the limitations and shortcomings of the prior art with a field programmable gate array having memory cells of which some or all can be rewritten. The apparatus of the present invention includes an array of logic blocks, an array of corresponding configuration memory cells, a data register, an address register and a memory configuration device. The memory cells are preferably arranged and coupled into a rectangular array of cell rows and columns. Each output of the data register is preferably coupled to a row of memory cells for loading data into that row of memory cells. Each output of the address register is coupled to a column of memory cells to specify which memory cells are to be loaded. The data register and address register are also coupled to the memory configuration device for storing data configurations in the memory cells. The memory configuration device preferably comprises a register, a decoder and a control unit for receiving a bit stream including a skip command, a write command and data. The memory configuration device allows the memory cells to be partially reconfigured by allowing each column of memory cells to be selectively written or skipped in response to the command input using the bit stream. The ability to partially reconfigure the memory cells is particularly advantageous when a user has an application which requires fast reconfiguration of part of the chip.

The present invention also comprises a method for partially reconfiguring the memory cells of a programmable gate array. One method includes the steps of: retrieving a packet from a bit stream; determining whether the packet is a write command; retrieving a frame of data from the bit stream if the packet is a write command; loading the frame of data into a data register if the packet is a write command; storing the frame of data into a group of memory cells if the packet is a write command; and incrementing an address register.

BRIEF DESCRIPTION OF THE DRAWINGS

FIG. 3A is a diagram of the required bit stream of the prior art used for reconfiguring the memory cells;

FIG. 3B is a diagram of an exemplary bit stream used for reconfiguring the memory cells according to the method of the present invention;

DETAILED DESCRIPTION OF THE PREFERRED EMBODIMENT

Figure 1A:
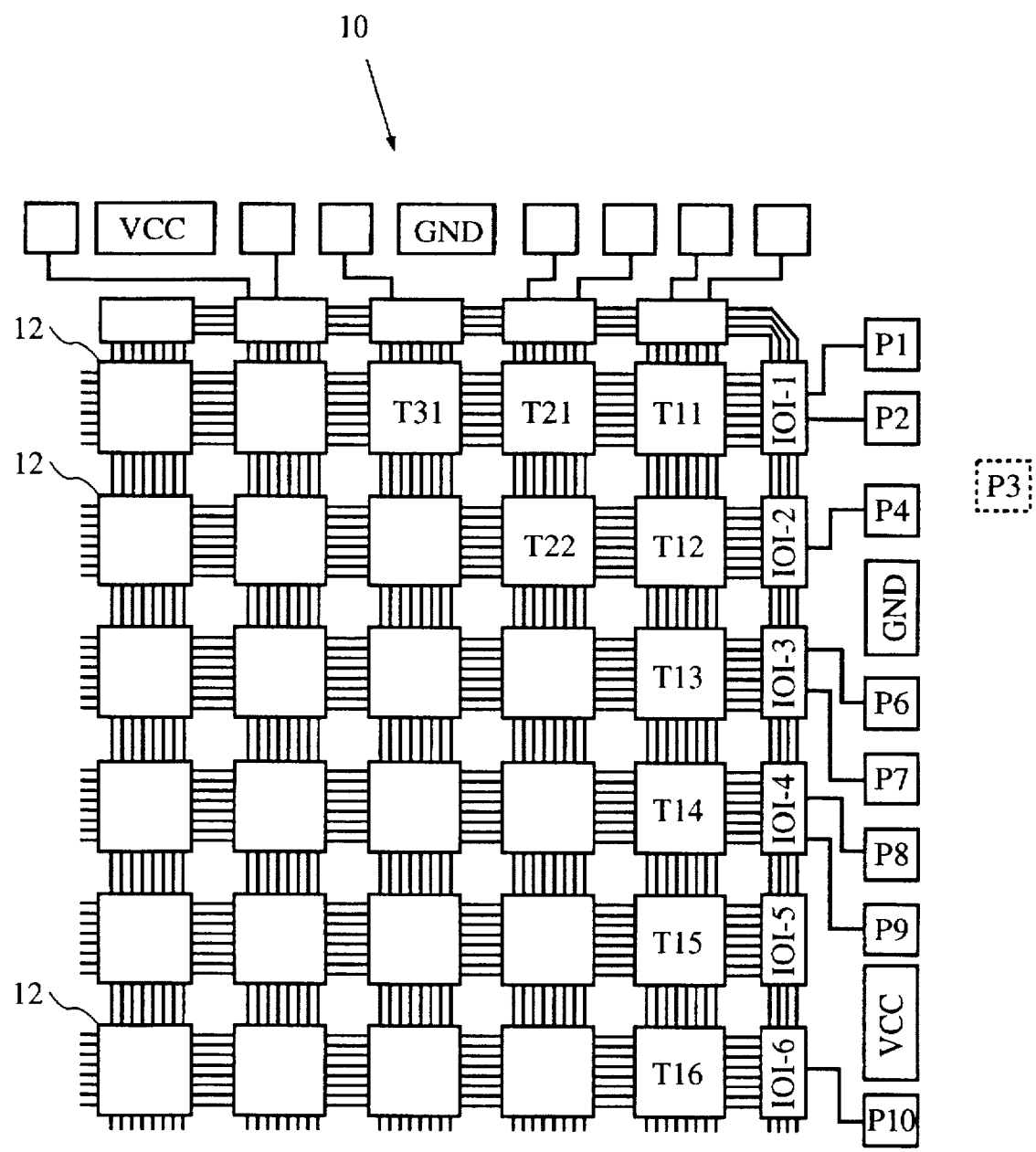
FIG. 1A is a block diagram of a preferred embodiment of a field programmable gate array of the present invention.
Figure 1B:
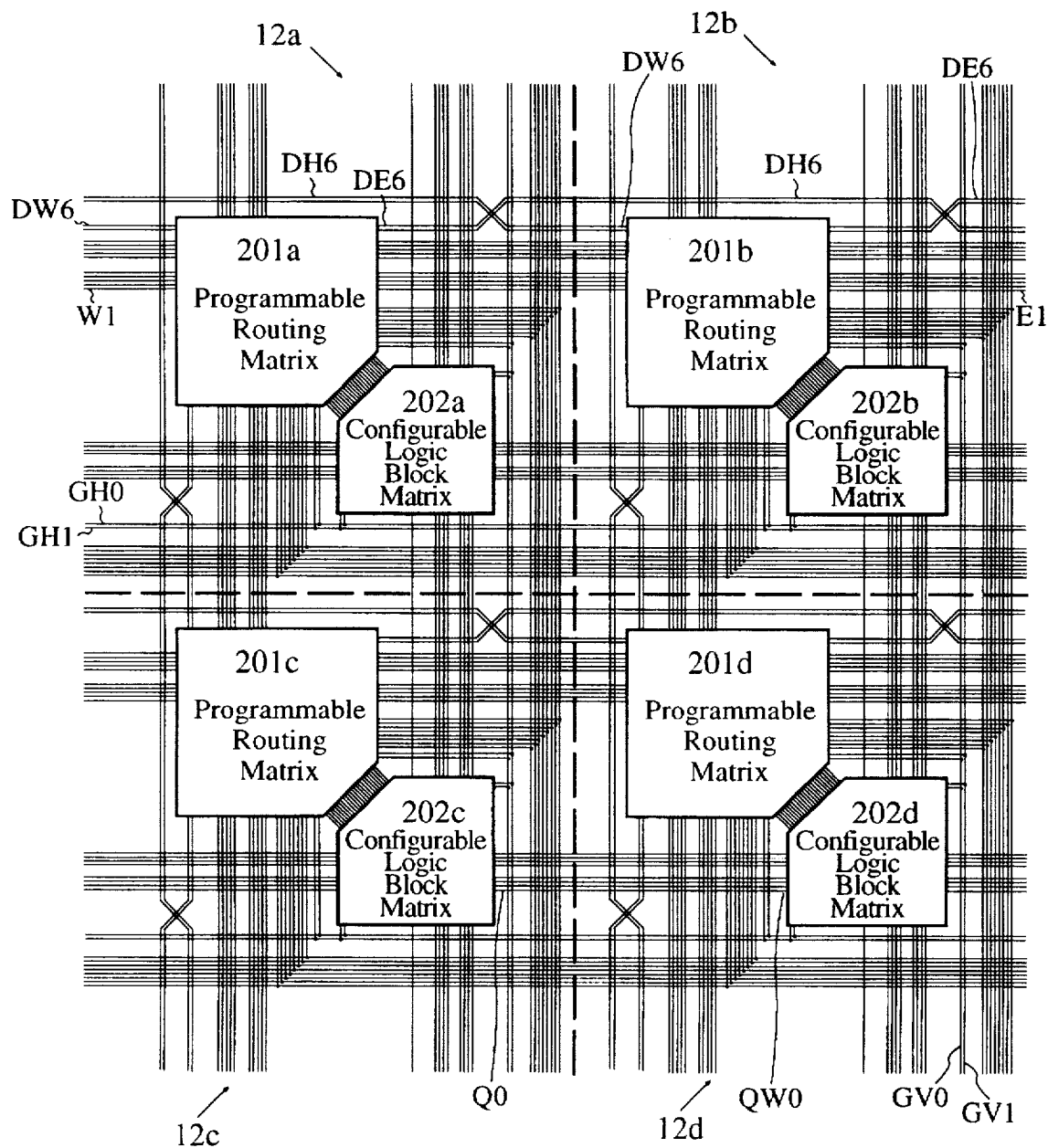
FIG. 1B is a block diagram of a preferred embodiment of a tile of the present invention.

FIG. 1A shows a block diagram of a portion of a field programmable gate array 10 with which the present invention may be used. The field programmable gate array 10 comprises a plurality of tiles 12. The tiles 12 are preferably arranged in an array as shown in FIG. 1A. As shown in FIG. 1B, each tile 12 includes a programmable routing matrix 201 and a configurable logic block matrix 202. Each tile 12 has a group of memory cells (not shown) associated with it. Some of the associated memory cells are coupled to the configurable logic block matrix 202 and some are coupled to the programmable routing matrix 201. Depending on the data stored in the associated group of memory cells, each logic block matrix 202 may be configured to perform one of a variety of logic functions. The inputs and outputs of each logic block matrix 202 may also be coupled through the programmable routing matrix 201 to the inputs and outputs of other logic blocks 202 or the inputs and outputs of the FPGA 10 in any one of a number of configurations. The coupling of the inputs and outputs is also specified by data stored in the associated group of memory cells. Detail of the structure shown in FIG. 1B is further discussed in U.S. patent application Ser. No. 08/222,138 incorporated herein by reference.

Figure 2:
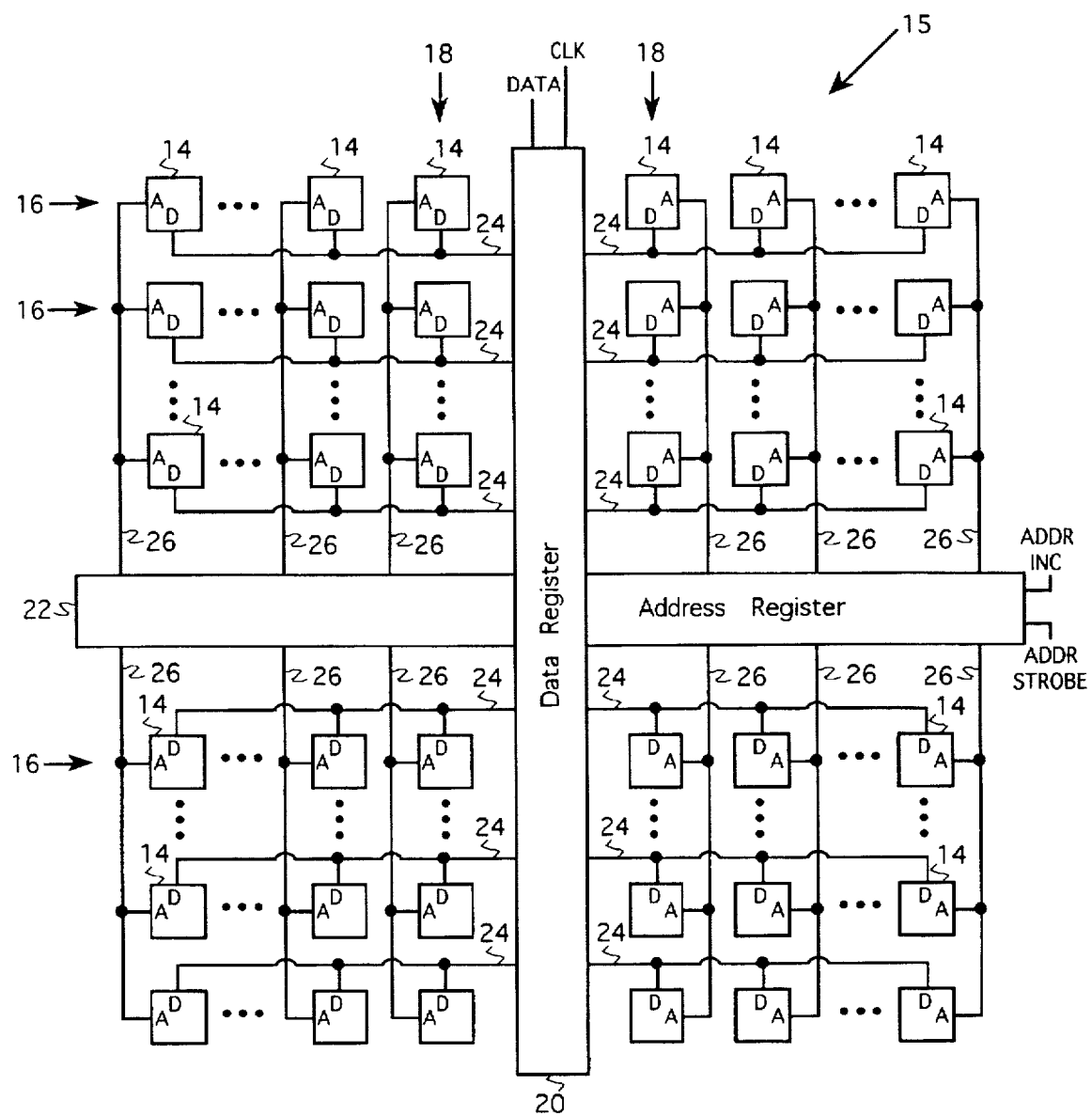
FIG. 2 is a block diagram of an array of memory cells, a data register and an address register of the field programmable gate array of the present invention.

Referring now to FIG. 2, a block diagram of the preferred embodiment of the memory cells 14 for the FPGA 10 is shown in more detail. The memory cells 14 are preferably arranged on the FPGA 10 as a regular array 15 in rows 16 and columns 18 of cells 14. In an exemplary embodiment, each tile 12 may have 408 (34 by 12) associated memory cells 14, and there may be as many as 400 tiles 12 in the FPGA 10. Thus, the array 15 may have as many as 163,200 memory cells 14. FIG. 2 illustrates only a portion of the array 15 of memory cells 14. Additional rows and columns of similarly coupled memory cells 14 are represented in FIG. 2 by ellipses. The memory cells 14 are preferably spaced apart across the FPGA 10 so that the cells 14 are positioned proximate the tile 12 with which they are associated. This arrangement advantageously reduces the area on the FPGA 10 that must be provided for interconnect structures that couple the memory cells 14 to their associated programmable routing matrix 201 and configurable logic block matrix 202.

In addition to having an output (not shown) that is coupled to one or several transistors of the appropriate tile 12, each of the memory cells 14 has an address input and a data input. In response to a signal on the address input, the signal applied to the data input is loaded into the memory cell 14. The memory cells 14 are preferably static random access memory (SRAM) cells, however, those skilled in the art will realize that the memory cells 14 may be implemented with other equivalent circuits such as an array of D-flip-flops or EPROM cells. The present invention also provides a plurality of row buses 24 and column buses 26 for coupling the data inputs and the address inputs, respectively, of the memory cells 14. In the preferred embodiment, each row bus 24 is coupled to the data input of each memory cell 14 in a row 16. Thus, there is one row bus 24 for each row 16 of memory cells 14 in the array 15. Similarly, each column bus 26 is coupled to the address input of each memory cell 14 in a column 18. There is one column bus 26 for each column 18 of memory cells 14 in the array 15. Thus, each time the address signal is asserted on a column bus 26, all the memory cells 14 in that column are loaded or written. Therefore, one column of data can be written to the array 15 simultaneously when the address is strobed.

The present invention also includes a data register 20 for storing a column of data before it is loaded into a column 18 of memory cells 14. The data register 20 is preferably a shift register having a data input, a CLK input and a plurality of data outputs. The data register 20 preferably stores a plurality of bits equal in number to the number of rows 16 of the array 15. Each data output of the data register 20 is coupled by a respective row bus 24 to the memory cells 14 in a respective row 16 of the array 15. For example, the first output of the data register 20 is coupled to the data inputs of the memory cells 14 in the first row of the array 15. The second output of the data register 20 is coupled to the data inputs of the memory cells 14 in the second row of the array 15. Each subsequent row 16 of memory cells 14 of the array 15 has data inputs similarly coupled to a data output of the data register 20. Since the data register 20 is a shift register, a column of data is loaded into the stages of the data register 20 by clocking the data register 20 once for each row 16 of the array 15. The data input of the data register 20 is preferably coupled to receive a bit stream of data to be loaded into the memory cells 14. The CLK input is preferably coupled to receive a CLK signal indicating the time when the data register should be clocked or shifted. While the data register 20 has been described as a shift register in this embodiment, those skilled in the art will realize that the present invention may be implemented with a plurality of shift registers or various other types of registers with additional couplings for loading.

The present invention also includes an address register 22 for specifying the column 18 of the array 15 that is to be loaded with data from the data register 20. The address register 22 is preferably a shift register having a serial input, an address increment input (ADDR INC input), an address strobe input (ADDR STROBE input) and a plurality of address outputs. The address register 22 preferably has a number of stages equal to the number of columns 18 in the array 15. Each stage stores a bit that specifies whether a particular column is to be addressed. Each stage also provides one of the plurality of address outputs. Each of the plurality of address outputs is coupled by a respective column bus 26 to the address input of memory cells 14 in a respective column 18 of the array 15. For example, the first output of the address register 22 is coupled to the address inputs of the memory cells 14 in the first column of the array 15. The second address output of the address register 22 is coupled to the address inputs of the memory cells 14 in the second column of the array 15. Each subsequent column 18 of memory cells 14 of the array 15 is similarly coupled to a respective address output of the address register 22. The address increment input provides a way of incrementing the address register 22. When an address increment signal (ADDR INC signal) is applied to the address increment input of the address register 22, the data is shifted one stage and the data on the serial input is loaded into the first stage. In an exemplary embodiment, initially the address register 22 would be cleared indicating that no column is addressed. Then an asserted or high bit would be applied to the serial input of the address register 22, and the address register 22 would be incremented by applying an address increment signal. The high bit would be shifted into the first stage of the address register 22, thereby addressing the first column of the array 15. Subsequently, non-asserted or low bits would serially be loaded into the address register 22. Thus, each time the address register 22 is incremented, the assertion bit is shifted and the next column is addressed. The present invention advantageously also includes an address strobe input for controlling whether the data in the address register 22 is applied to the plurality of address outputs. This is particularly advantageous because only when the address strobe signal (ADDR STROBE signal) is applied will the address stored in the address register 22 be applied to the memory cells 14 of the array 15.

While the data register 20 has been described as having an number of stages equal to the number of rows 16 in the array 15, and the address register 22 has been described as having an number of stages equal to the number of columns 18 in the array 15, those skilled in the art will realize that the data register 20 and the address register 22 may provide additional stages with the outputs of some of the stages not being coupled to a respective row 16 or column 18.

The present invention is particularly advantageous because it allows portions of the array 15 to be re-written while preserving the contents of the remainder of the array 15. In the prior art, any reconfiguration of the memory cells 14 required that all the cells 14 of the array 15 be re-written. An exemplary bit stream used to reconfigure the prior art is shown in FIG. 3A. The prior art only executes write commands for changing the data in the memory cells. Therefore, the bit stream required that there be a write control sequence followed by a column or frame of data for each column of the array. The problem with using the prior art approach to perform reconfiguration when very few memory cells are changed is that loading new data into every column of the array 15 requires too much time. However, the present invention overcomes this problem by providing a skip command which is not followed by a data frame, and a novel memory configuration device 30 that recognizes the skip command for selectively loading data into memory cells 14 of the FPGA 10. An exemplary bit stream for the present invention is shown in FIG. 3B. The process of reconfiguring the array 15 using the present invention eliminates data frames for all columns not being reconfigured, and thus, greatly reduces the time required to reconfigure the memory cells since the time required to load the data register is saved for any columns where the new configuration data is the same.

Figure 4:
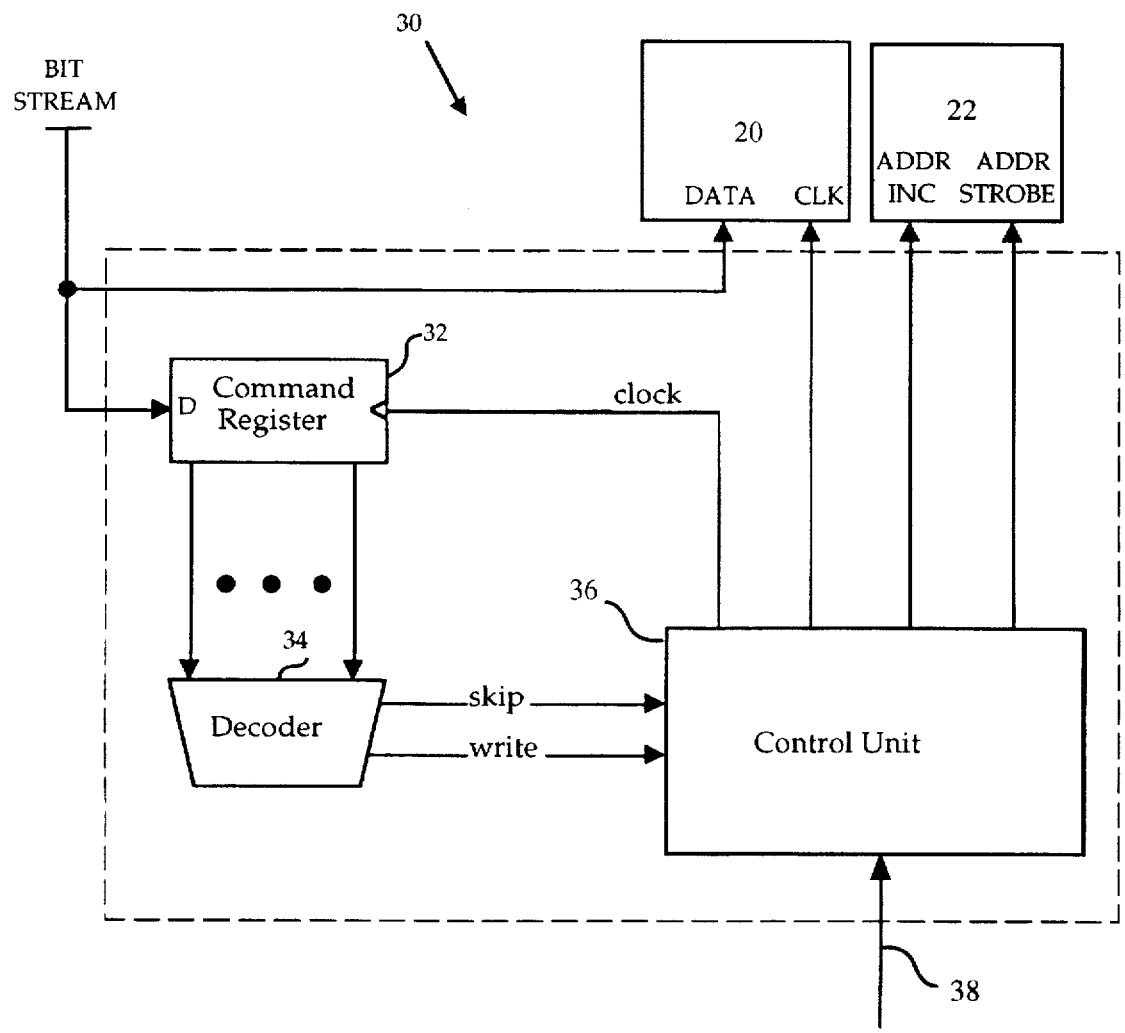
FIG. 4 is a block diagram of a preferred embodiment of a memory configuration device of the present invention.

Referring now to FIG. 4, a preferred embodiment of a memory configuration device 30 for controlling the loading of the data register 20 and the address register 22 to store data in the memory cells 14 is shown. The memory configuration device 30 advantageously provides for partial reconfiguration of the memory cells 14 using a skip command. The memory configuration device 30 receives a bit stream including such commands and data as represented in FIG. 3B. In response to the bit stream, the memory configuration device 30 generates control signals including a data signal on a data output, a CLK signal on a CLK output, an ADDR INC signal on an ADDR INC output, and an ADDR STROBE signal on an ADDR STROBE output. The memory configuration device 30 preferably comprises a command register 32, a decoder 34 and a control unit 36 for decoding the bit stream input and generating the output signals.

The command register 32 is a data register for serially loading and storing data from the bit stream. The command register 32 preferably has a data input, a clock input, and at least one data output. The command register 32 is preferably a serial in, parallel out shift register. The command register 32 is preferably able to store as many bits as are used to identify the write and skip commands in the bit stream. In a very basic embodiment, the command register 32 may be a single D-flip-flop if the write command and the skip command are represented in the bit stream by a single bit. In such an embodiment, the decoder 34 would be unnecessary and the output of the command register 32 could be provided directly to the control unit 36. Nonetheless, in the preferred embodiment, the command register 32 will store a plurality of bits and have a plurality of data outputs. The data input of the command register 32 is coupled to receive the bit stream. The clock input of the command register 32 is coupled to the control unit 36 for receiving a clock signal.

The decoder 34 is preferably a decoder for identifying whether the signals input match either the skip command or the write command. The decoder 34 preferably has a plurality of inputs, a skip output, and a write output. The inputs of the decoder 34 are equal in number and are coupled to the data outputs of the command register 32. The decoder 34 receives the data stored in the command register 32 and determines whether the data is the same as either a write command or a skip command. In response, the decoder 34 generates a signal on either the skip output or the write output. In an alternate embodiment, the skip and write signal may be combined since they may be inverses of each other and be provided on a single output to the control unit 36. In yet another alternate embodiment where the command register 32 stores two bits, the decoder 34 may also be combinational logic. For example, if the bits 00 are a write command and the bits 11 are a skip command, the decoder may be implemented with AND gates and inverters. Thus, those skilled in the art will realize that the decoder 34 may be implemented with various combinational logic and decoders depending upon the number of bits stored in the command register 32.

The final portion of the memory configuration device 30 is a control unit 36. The control unit 36 is preferably logic for implementing a state machine that produces the clock, CLK, ADDR INC, and ADDR STROBE signals. The control unit 36 can selectively assert the ADDR STROBE signal such that the ADDR STROBE signal is not asserted in response to a skip command thereby eliminating the need to write columns of memory cells 14 that are unchanged with respect to the prior configuration. The control unit 36 has at least one input coupled to the decoder 34 for receiving the skip and write signals. In particular, the control unit 36 preferably has a skip input and a write input coupled to the skip output and the write output of the decoder 34, respectively. The control unit 36 has a clock output that is coupled to the clock input of the command register 32. Control unit 36 also has a CLK output coupled to the CLK input of data register 20 (FIG. 2). These clock outputs may be derived from a system clock signal on line 38. The data input of data register 20 is preferably coupled to receive selected columns of the bit stream in response to a write input for each selected column. The ADDR INC and ADDR STROBE outputs of the control unit 36 of FIG. 4 provide ADDR INC and ADDR STROBE inputs, respectively, to the address register 22 of FIG. 2.

Figure 5:
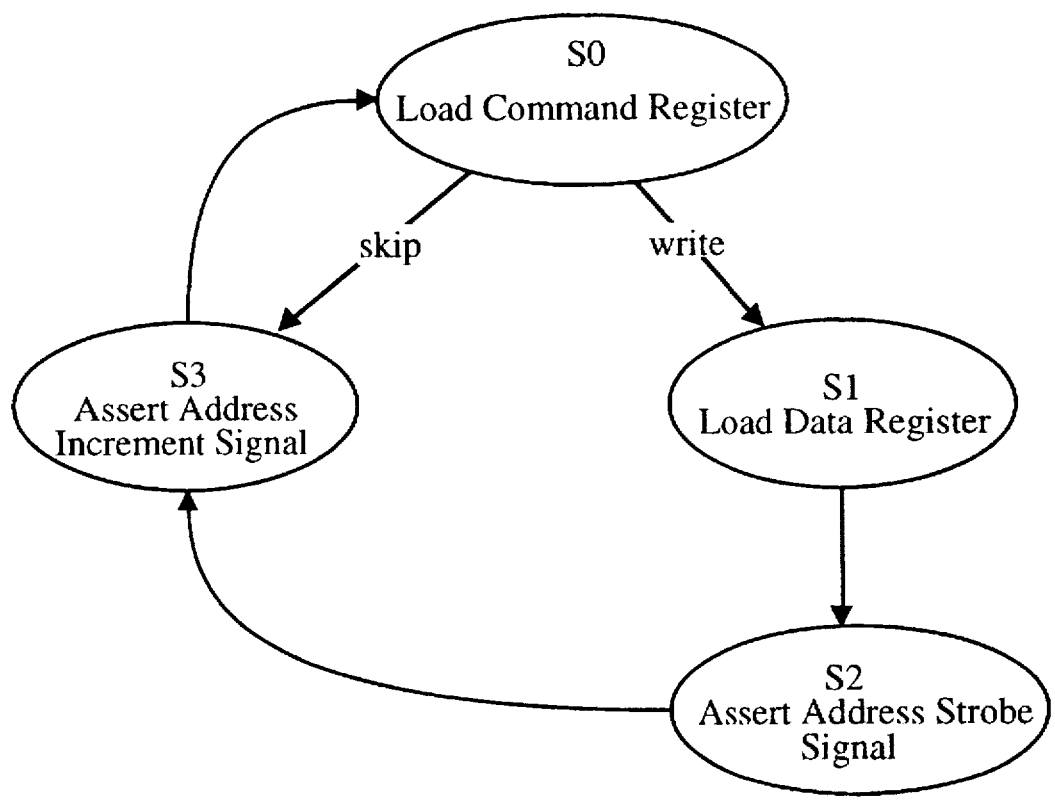
FIG. 5 is a state diagram for the control unit of the memory configuration device of the present invention.

Referring now to FIG. 5, a state diagram of one embodiment of the control unit 36 of FIG. 4 is shown. The control unit 36 preferably has four states: S0, S1, S2 and S3. The control unit 36 is initially in state S0 until a bit stream begins to be input to the control unit 36. In state S0, the control unit 36 asserts the clock signal on the clock output a predetermined number of times to serially load the command register 32 with data in the bit stream. The number of times the clock signal is asserted is determined by the number of bits that are used to define the skip and write commands. Alternatively, in state S0, the clock signal may be continuously asserted until either the skip or the write signal is asserted by decoder 34. After the clock signal has been asserted the predetermined number of times, the skip and write inputs are tested. If neither the skip signal nor the write signal is present, the control unit 36 remains in state S0 and returns to loading the command register 32. This indicates that no bit-stream is present or that another command to which the control unit 36 does not react is in the bit stream.

However, if the skip signal is asserted after the command register 32 is loaded, then the control unit 36 transitions from state S0 to state S3. The present invention eliminates the execution of states S1 and S2 in response to the skip signal, thereby greatly reducing the time required to re-configure the memory cells 14. The address increment signal is asserted on the ADDR INC output in state S3 as will be described in more detail below.

On the other hand, if the write signal is asserted after command register 32 is loaded, then control unit 36 transitions from state S0 to state S1. In state S1, control unit 36 repeatedly asserts the CLK signal on the CLK output to load the data frame in the bit stream into data register 20. The data frame is a column of data to be stored in a column 18 of memory cells 14. The data is serially loaded into data register 20. Therefore, the CLK signal is asserted a number of times equal to the number of stages in the data register 20. Before the repeated assertion of the CLK signal, other signals not shown in FIG. 4 may be exchanged between control unit 36 and data register 20 to control loading of a data frame into data register 20. Such signals include a signal for clearing the data register 20 and a control bit or control sequence loaded into data register 20. This control bit or control sequence will shift through data register 20 and into control unit 36 when the frame has been fully loaded. This communication between data register 20 and control unit 36 is discussed in more detail in U.S. Pat. No. 5,400,6871.

Once the data frame in the bit stream has been loaded into the data register 20, the control unit 36 transitions from state S1 to state S2. In state S2, the control unit 36 asserts the address strobe signal on the ADDR STROBE output. The assertion of the address strobe signal causes the data stored in the data register 20 to be loaded into a column 18 of memory cells 14 that is addressed or specified by the address register 22.

After state S2, the control unit 36 transitions to state S3. State S3 can also be reached directly from state S0 in response to the presence of a skip signal on the skip input as has been noted above. In state S3, the control unit 36 asserts the address increment signal. This causes the address register 22 to address the next column of the array 15. Thus in the preferred embodiment, the bit stream must include either a skip command or a write command for each column 18 of memory cells 14 in the array 15. Therefore, the addition of the skip command allows the address register 22 to be incremented to address the next column 18 of the array 15 without having to load the data register 20 which takes a significant amount of time. After the address increment signal is asserted, the control unit 36 transitions from state S3 back to state S0.

Figure 6:
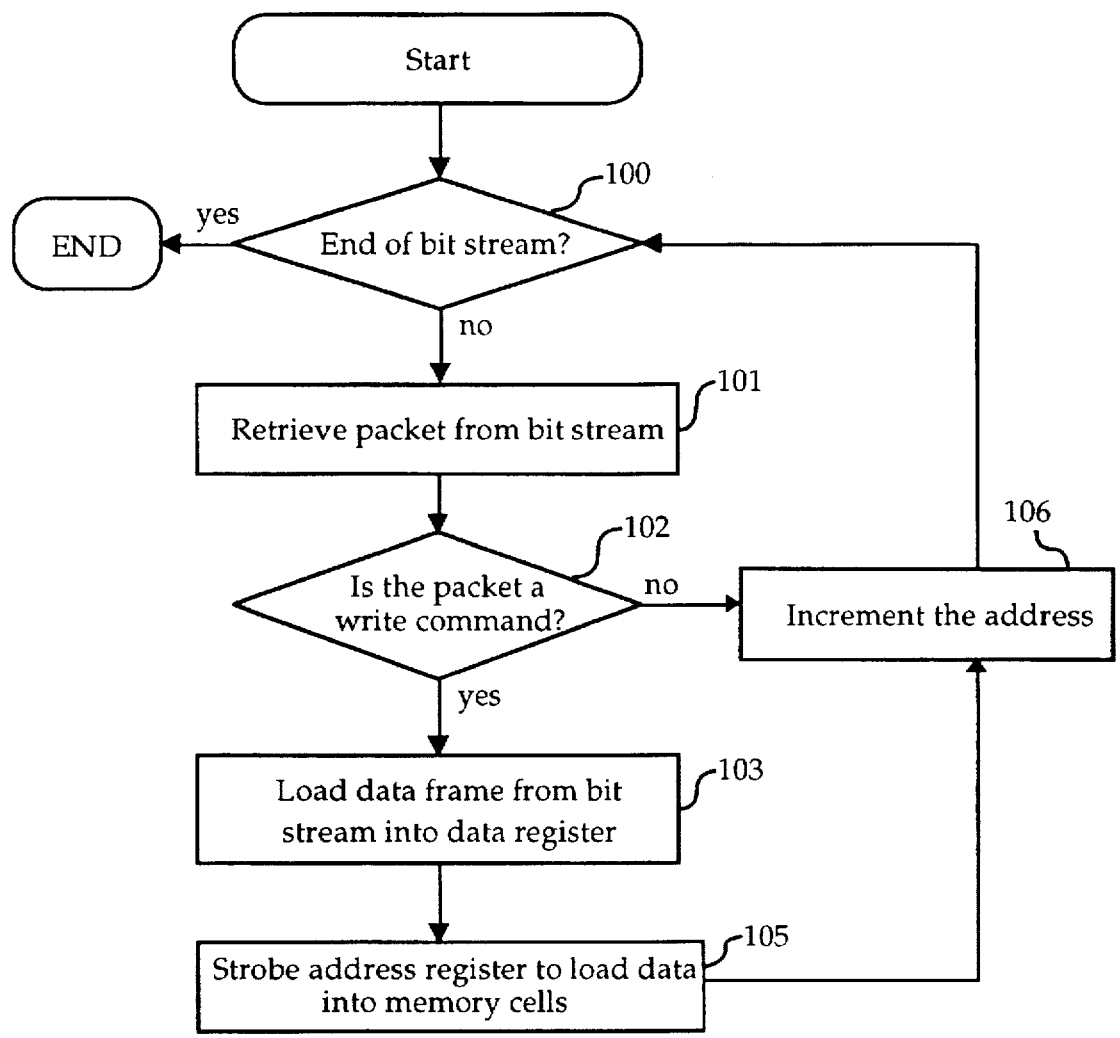
FIG. 6 is a flow chart of a preferred method for reconfiguring the memory cells of a field programmable gate array according to the present invention.

Referring now to FIG. 6, a method for reconfiguring the memory cells 14 of the FPGA 10 constructed in accordance with the present invention is shown. The user specifies which memory cells 14 are to be reconfigured or written with modified data by providing a bit stream that identifies the columns 18 of memory cells 14 to be skipped, the columns 18 of memory cells 14 to be written, and the data to be written to the memory cells 14. The bit stream preferably has either a skip command or a write command for each column 18 of cells 14 in the array 15. The method begins with step 100. In step 100, the method tests whether the end of the bit stream has been reached. When the end of the bit stream has been reached, the method is complete and ends. In one embodiment, the memory configuration device 30 has logic for detecting when the end of the bit stream has been reached. If the end of the bit stream has not been reached, the method continues to step 101. In step 101, the method retrieves a packet of bits or a command from the bit stream. The number of bits in the packet is predetermined and is as many as necessary to define the commands. Next in step 102, the preferred method tests whether the packet retrieved in step 101 is a write command. If the packet retrieved is not a write command, then the command must be a skip command and the method continues to step 106 as will be described below. On the other hand, if the packet retrieved is a write command, the method proceeds to step 103. In step 103, a data frame is retrieved from the bit stream and loaded into data register 20. The data frame may be serially loaded into the shift register that forms the data register 20 or loaded several bits in parallel as discussed in U.S. Pat. No. 5,430,687. Next in step 105, the ADDR STROBE signal is asserted to enable the column of memory cells 14 addressed by address register 22, and thereby store the data frame in a column 18 of memory cells 14. In step 106, the method increments the address register 22 to address the next column 18 of memory cells 14 in the array 15. After step 106, the method returns to step 100 to process any remaining commands in the bit stream.

While the present invention has been described with reference to certain preferred embodiments, those skilled in the art will recognize that various modifications may be provided. For example, control unit 36 may use a variety of counters, registers and combinational logic for its implementation of states S0, S1, S2, and S3. Further, the control unit 36 may provide additional states for determining the beginning and end of a bit stream. These and other variations upon and modifications to the preferred embodiment are provided for by the present invention which is limited only by the following claims.

What is claimed is:

1. In a programmable logic device having a plurality of memory cells, an apparatus for partially configuring the memory cells, the apparatus comprising;

an address register for identifying memory cells into which data are to be loaded, the address register having an increment input terminal, and at least one address output terminal coupled to the memory cells;

a memory configuration device for recognizing a command in a bit stream including a skip command and a write command and having means for, in response to a skip command, applying an increment signal to the address register increment input terminal without loading a plurality of data bits from the bit stream; and means for, in response to a write command, loading a plurality of data bits from the bit stream into a plurality of memory cells addressed on the at least one address output terminal of the address register, and applying an increment signal to the address register increment input terminal;

a data register for storing data to be loaded into the memory cells, the data register having a data input terminal, a clock input terminal, and at least one data output terminal coupled to the memory cells; and wherein the memory configuration device has means for, in response to the write command, applying a clock signal to the data register clock input terminal, and shifting the plurality of data bits from the bit stream into the data register.

2. The apparatus of claim 1 in which the address register further has a strobe input terminal coupled to the memory configuration device to receive an address strobe signal, wherein when the address strobe signal is applied a plurality of memory cells are addressed and the plurality of data bits from a data register for storing data to be loaded into the memory cells are stored into the addressed plurality of memory cells.

3. The apparatus of claim 1, wherein the address register further has a strobe input terminal coupled to receive an address strobe signal from the memory configuration device, wherein when the address strobe signal is applied, the address stored in the address register is applied to one column of memory cells and the address stored in the address register is incremented in response to a signal on the increment input terminal; and the memory configuration device having a bit stream input terminal, a clock output terminal, an increment output terminal and a strobe output terminal, the bit stream input terminal of the memory configuration device being coupled to receive the bit stream, the clock output terminal of the memory configuration device being coupled to a clock input terminal of a data register, the increment output terminal of the memory configuration device being coupled to the increment input terminal of the address register, and the strobe output terminal of the memory configuration device being coupled to a strobe input terminal of the address register.

4. The apparatus of claim 1, wherein the memory cells are arranged in an array having columns and rows, wherein a data register has a plurality of data output terminals and each of the plurality of data output terminals is coupled to a respective row of memory cells, and wherein the address register has a plurality of address output terminals and each of the plurality of address output terminals is coupled to a respective column of memory cells.

5. The apparatus of claim 4, wherein the data register is a serial in, parallel out shift register, and wherein the shift register has stages equal in number to the rows of the array.

6. The apparatus of claim 4, wherein the address register is a serial in, parallel out shift register, and wherein the shift register has stages equal in number to the columns of the array.

7. The apparatus of claim 1, wherein the memory configuration device comprises:

a command register for receiving memory configuration commands, having a data input terminal, a data output terminal and a clock input terminal, the data input terminal of the command register being coupled to receive a bit stream;

a control unit having an input terminal and output terminals for generating signals for controlling a data register and the address register in response to a command in the command register, the input terminal of the control unit being coupled to the data output terminal of the command register for receiving a command, the output terminals of the control unit being coupled to said increment input terminal of the address register and a clock input terminal of the data register.

8. The apparatus of claim 7, wherein the command register is a D-flip-flop.

9. The apparatus of claim 7, wherein the command register is a serial in, parallel out shift register.

10. The apparatus of claim 9, wherein the control unit generates a clock signal on a clock output terminal for loading the command register, and wherein the clock output terminal of the control unit is coupled to said clock input terminal of the command register.

11. The apparatus of claim 7, wherein the memory configuration device further comprises:

a decoder having a plurality of input terminals and an output terminal for decoding data stored in the command register into a skip signal, the input terminals of the decoder being coupled to the data output terminal of the command register, the output terminal of the decoder being coupled to the input terminal of the control unit.

12. The apparatus of claim 7, wherein the control unit is a state machine having:

a first state where data in the bit stream are loaded into the command register, a second state where data in the bit stream are loaded into the data register, a third state where the data in the data register are applied to the memory cells, and a fourth state where the address register is incremented.

13. A method for partially configuring memory cells of a programmable logic device, the method comprising the steps of:

receiving a bit stream of data for configuring the memory cells;

retrieving a packet of data from the bit stream;

determining whether the packet of data is a write command or a skip command;

if the packet is a write command, retrieving a frame of data from the bit stream;

loading the frame of data into a data register, the data register for storing the data to be loaded into the memory cells;

storing the frame of data in one of a plurality of groups of memory cells; and incrementing an address in an address register to select a next group of cells as the location for storing a next frame of data; and if the packet is skip command, incrementing the address in the address register to select the next group of cells as the location for storing the next frame of data without loading a frame of data from the bit stream into the data register.

14. The method of claim 13, wherein the step of retrieving a packet of data from the bit stream is performed by serially loading a data register for storing data to be loaded into the memory cells.

15. The method of claim 13, wherein the step of determining whether the packet of data is a write command comprises the steps of:

loading the packet into a register for storing the packet of data; and comparing the output signals of the register to predefined values.

* * * * *

UNITED STATES PATENT AND TRADEMARK OFFICE
CERTIFICATE OF CORRECTION

PATENT NO. : 5,781,756
DATED : July 14, 1998
INVENTOR(S) : Lawrence C. Hung

It is certified that error appears in the above-identified patent and that said Letters Patent is hereby corrected as shown below:

Col. 1, line 9, change "on" to --or--

Col 7, line 66 and 67, change "5,400,6871" to --5,430,687--

Signed and Sealed this

Seventeenth Day of August, 1999

Attest:

Q. TODD DICKINSON

Attesting Officer

Acting Commissioner of Patents and Trademarks